United States Patent
Makino et al.

(10) Patent No.: US 7,602,651 B2
(45) Date of Patent: Oct. 13, 2009

(54) SEMICONDUCTOR INTEGRATED CIRCUIT DEVICE

(75) Inventors: Eiichi Makino, Yokohama (JP); Shigeo Ohshima, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 112 days.

(21) Appl. No.: 11/953,319

(22) Filed: Dec. 10, 2007

(65) Prior Publication Data

US 2008/0151640 A1    Jun. 26, 2008

(30) Foreign Application Priority Data

Dec. 13, 2006    (JP)   ............................ 2006-335792

(51) Int. Cl.
*G11C 16/06*    (2006.01)

(52) U.S. Cl. ........................... 365/185.23; 365/185.18; 365/189.05; 365/230.06

(58) Field of Classification Search ............ 365/185.23, 365/185.18, 189.05, 189.11, 189.07, 189.08, 365/230.06

See application file for complete search history.

(56) References Cited

U.S. PATENT DOCUMENTS 5,592,419 A * 1/1997 Akaogi et al. .......... 365/185.18

FOREIGN PATENT DOCUMENTS

| JP | 63-146511 | 6/1988 |
| JP | 5-102827 | 4/1993 |
| JP | 11-120784 | 4/1999 |

* cited by examiner

*Primary Examiner*—David Lam
(74) *Attorney, Agent, or Firm*—Oblon, Spivak, McClelland, Maier & Neustadt, L.L.P.

(57) ABSTRACT

This disclosure concerns a device outputting data to the outside comprising a first transistor with a first conductive type which is connected between an output low voltage corresponding to a first logical value and the pad and which connects the output low voltage to the pad when the digital data has the first logical value; a second transistor with a second conductive type which is connected between an output high voltage corresponding to a second logical value and the pad and which connects the output high voltage to the pad when the digital data has the second logical value; and a third transistor with the first conductive type which is connected between the output high voltage and the pad so as to be parallel to the second transistor and which connects the output high voltage to the pad when the digital data has the second logical value.

18 Claims, 10 Drawing Sheets

DATA OUTPUT UNIT

SEMICONDUCTOR INTEGRATED CIRCUIT DEVICE

CROSS-REFERENCE TO RELATED APPLICATION

This application is based upon and claims the benefit of priority from the prior Japanese Patent Application No. 2006-335792, filed on Dec. 13, 2006, the entire contents of which are incorporated herein by reference.

BACKGROUND OF THE INVENTION

1. Field of the Invention

The present invention relates to a semiconductor integrated circuit device, and, for example to a semiconductor integrated circuit device that outputs digital data from an internal circuit via a pad to the outside.

2. Related Art

In semiconductor integrated circuit devices such as NAND flash memories, an I/O supply voltage used for data output recently tends to decrease because of reduced power consumption and noise reduction. When the I/O supply voltage decreases, the conductance of the data output circuit may be reduced. For example, when an I/O power supply is switched via a P-type transistor to an I/O pad, a gate-source voltage of the P-type transistor during an ON operation may decrease because of a decrease in the I/O supply voltage. The conductance of the P-type transistor is reduced and then an output slew rate may decrease. That is, a data output rate of the semiconductor integrated circuit device may decrease.

SUMMARY OF THE INVENTION

A semiconductor integrated circuit device outputting digital data from an internal circuit via a pad to the outside according to an embodiment of the present invention comprises a first transistor with a first conductive type which is connected between an output low voltage corresponding to a first logical value and the pad and which connects the output low voltage to the pad when the digital data has the first logical value; a second transistor with a second conductive type which is connected between an output high voltage corresponding to a second logical value and the pad and which connects the output high voltage to the pad when the digital data has the second logical value; and a third transistor with the first conductive type which is connected between the output high voltage and the pad so as to be parallel to the second transistor and which connects the output high voltage to the pad when the digital data has the second logical value.

A semiconductor integrated circuit device outputting digital data from an internal circuit via a pad to the outside according to an embodiment of the present invention comprises a memory cell array; and a data output circuit outputting the digital data from the memory cell array comprises a first transistor with a first conductive type which is connected between an output low voltage corresponding to a first logical value and the pad and which connects the output low voltage to the pad when the digital data has a first logical value; a second transistor with a second conductive type which is connected between an output high voltage corresponding to a second logical value and the pad and which connects the output high voltage to the pad when the digital data has a second logical value; and a third transistor with the first conductive type which is connected between the output high voltage and the pad so as to be parallel to the second transistor and which connects the output high voltage to the pad when the digital data has the second logical value.

DETAILED DESCRIPTION OF THE INVENTION

Embodiments of the present invention will be explained below in detail with reference to the accompanying drawings. Note that the invention is not limited thereto.

FIRST EMBODIMENT

Figure 1:
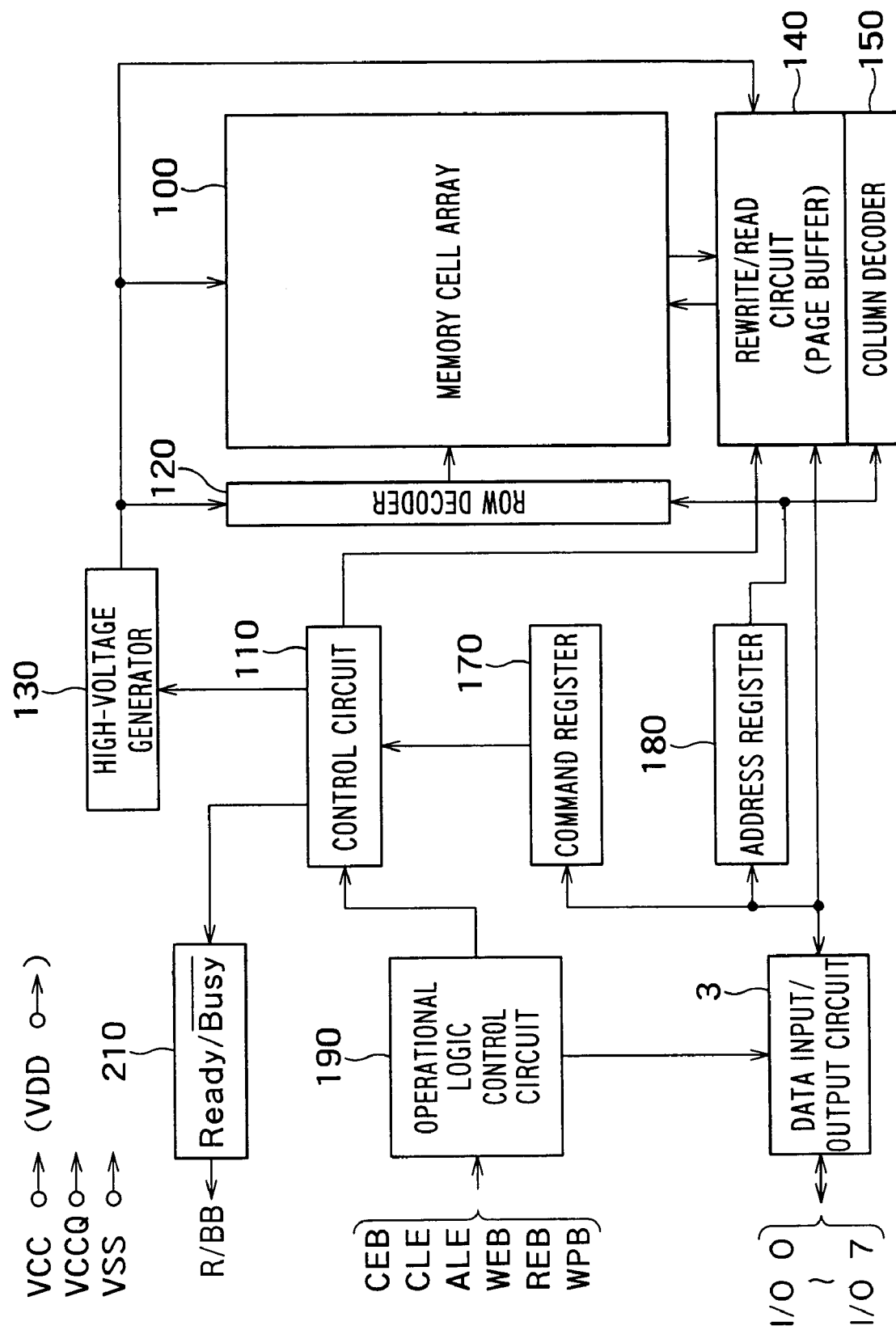
FIG. 1 is a block diagram showing the overall configuration of a flash memory according to a first embodiment.

FIG. 1 is a block diagram showing the overall configuration of a flash memory according to the embodiments of the present invention. A memory cell array 100 includes NAND cell units (not shown) configured by connecting serially a plurality of electrically rewritable non-volatile memory cells with the stacked gate configuration. The NAND cell unit is connected to a bit line on its drain side and to a common source line on its source side. Control gates of the memory cells arranged in the row direction are connected commonly to a word line. A rewrite/read circuit 140 includes a sense amplifier circuit and a latch circuit provided for every bit line in order to write/read data on a page basis and will be referred to as a page buffer.

A data input/output circuit 3 is used to input/output the data and to input address signals. The data is transferred via the data input/output circuit 3 between I/O terminals I/O 0 to I/O 7 and the data rewrite/read circuit 140. The address signal inputted from the I/O terminals is held in an address register 180, sent to a row decoder 120 and a column decoder 150, and decoded.

Operational control commands are inputted from the I/O terminals. The inputted commands are decoded and held in a command register 170 in order to control a control circuit 110. External control signals including a chip enable signal CEB, a command latch enable signal CLE, an address latch enable signal ALE, a write enable signal WEB, and a read enable signal REB are loaded in an operational logic control circuit 190 and internal control signals are generated depending on operational modes. The internal control signal is used to control data latch and data transfer in the data input/output circuit 3. Further, the internal control signal is sent to the control circuit 110 where the operational control is performed. A ready/busy resister 210 externally informs whether a chip is in a ready state or in a busy state.

A NAND flash memory is described for the embodiments of the semiconductor integrated circuit device. The present invention can be applied to any semiconductor integrated circuit devices that output digital data such as DRAM, CPU, and logic LSI.

Figure 2:
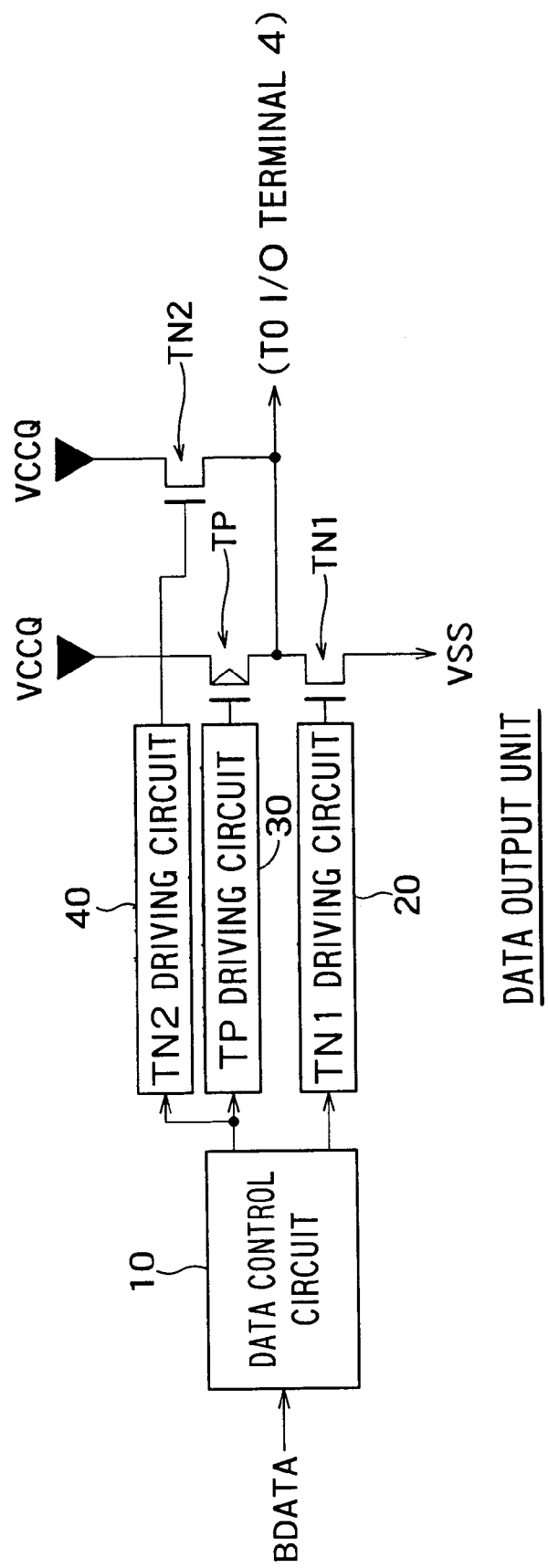
FIG. 2 shows the configuration of a data output unit in the data input/output circuit 3.

FIG. 2 shows the configuration of a data output unit in the data input/output circuit 3. The data output unit includes a data control circuit 10, a TN1 driving circuit 20 as a first driving circuit, a TP driving circuit 30 as a second driving circuit, a TN2 driving circuit 40 as a third driving circuit, an N-type field-effect transistor TN1 as a first transistor, a P-type field-effect transistor TP as a second transistor, and an N-type field-effect transistor TN2 as a third transistor. The transistor TN1 is for low level (VSS) output, while the transistors TP and TN2 are for high level (VCCQ) output.

The data output unit utilizes VCC, VDD, VCCQ, and VSS as voltage sources. VCC indicates an external supply voltage provided from the outside of the chip to the chip as described above. VDD is obtained by reducing down the external supply voltage VCC (hereinafter, internal step-down potential). VCCQ indicates a voltage to be outputted to the outside via the I/O terminal 4 when digital data stored in a memory cell is logically high (data BDATA is logically low) (hereinafter, output high voltage). VSS indicates a voltage to be outputted to the outside via the I/O terminal 4 if the digital data stored in the memory cell is logically low (data BDATA is logically high) (hereinafter, output low voltage). These supply voltages satisfy the relationship VCC>VDD>VCCQ>VSS. If VCC is, e.g., 3V, VDD is obtained by stepping down VCC, e.g., 2 to 2.7V. VCCQ is, e.g., 1.8V, while VSS is the ground potential. "Logically high" is simply referred to as high or high level. "Logically low" is simply referred to as low or low level. VCCQ and VSS can be used for inputting data.

The transistor TN1 is connected between the output low voltage VSS and the I/O terminal 4 and connects the output low voltage VSS to the I/O terminal 4 when the digital data is low (BDATA is high). The transistor TP is connected between the output high voltage VCCQ and the I/O terminal 4 and connects the output high voltage VCCQ to the I/O terminal 4 when the digital data is high (BDATA is low). The transistor TN2 is connected between the output high voltage VCCQ and the I/O terminal 4 so as to be in parallel to the transistor TP and connects the output high voltage VCCQ to the I/O terminal 4 when the digital data is high. The transistor TN1 is activated when the data stored in the memory cell is low and deactivated when the data is high. The transistors TP and TN2 are activated when the data stored in the memory cell is high and deactivated when the data is low.

The TN1 driving circuit 20 is connected to a gate of the transistor TN1. The TN1 driving circuit 20 turns the transistor TN1 on when the digital data stored in the memory cell is low (BDATA is high) and off when the data is high (BDATA is low). The TP driving circuit 30 is connected to a gate of the transistor TP, turns the transistor TP off when the digital data is low (BDATA is high), and on when the data is high (BDATA is low). The TN2 driving circuit 40 is connected to a gate of the transistor TN2, turns the transistor TN2 off when the digital data is low (BDATA is high), and on when the digital data is high (BDATA is low).

The data control circuit 10 obtains the data stored in the memory cell through the read circuit 140 shown in FIG. 1. In the first embodiment, the data output unit receives the inverted data BDATA of the data stored in the memory cell. The data control circuit 10 performs control so that the TN1 driving circuit 20, TP driving circuit 30, and TN2 driving circuit 40 operate according to the logical values of BDATA as described above.

Figure 3:
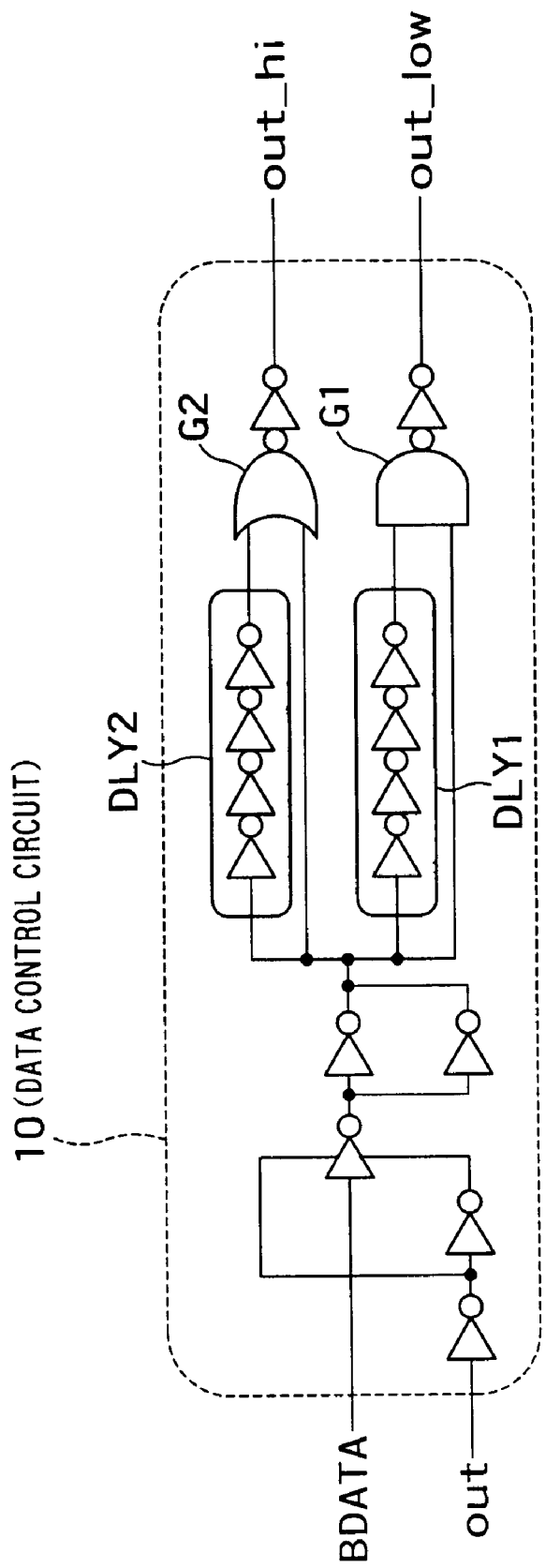
FIG. 3 shows the configuration of the data control circuit 10.
Figure 4:
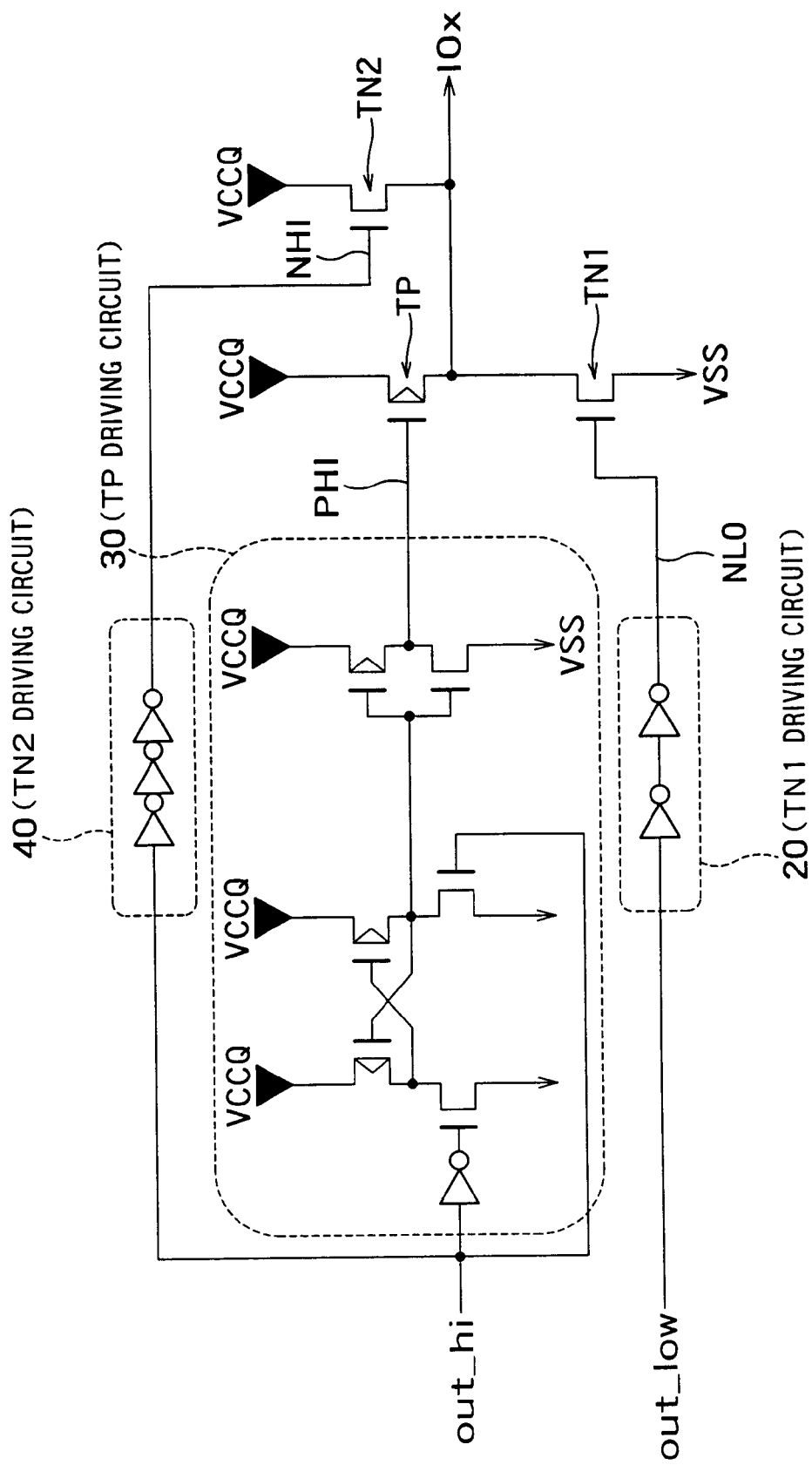
FIG. 4 shows the configurations of the TN1 driving circuit 20, TP driving circuit 30, TN2 driving circuit 40, and data output circuit.

FIG. 3 shows the configuration of the data control circuit 10. FIG. 4 shows the configurations of the TN1 driving circuit 20, TP driving circuit 30, TN2 driving circuit 40, and data output circuit.

The data control circuit 10 includes a first delay circuit (a first control circuit) DLY1, a second delay circuit (a second control circuit) DLY2, a NAND gate G1, and a NOR gate G2. The NAND gate G1 receives the output of the first delay circuit DLY1 and the signal BDATA then outputs their AND operational result as a signal out_low. The NOR gate G2 receives the output of the second delay circuit DLY2 and the signal BDATA then outputs their OR operational result as a signal out_hi. The data control circuit 10 sets the signals out_hi and out_low to be logically high if BDATA shifts from low to high and to be logically low if BDATA shifts from high to low.

The signal out determines the timing of BDATA to be inputted to the data control circuit 10. The signal out allows the data output unit to start the operation, and output signals based on BDATA are outputted from the I/O terminal 4.

In the first delay circuit DLY1 and second delay circuit DLY2, the rise or fall timings of the signals out_hi and out_low are shifted from each other. More specifically, if BDATA is high, the NOR gate G2 raises the signal out_hi so as to be high regardless of signal delays by the second delay circuit DLY2. The NAND gate G1 raises the signal out_low to be high lagging behind the NOR gate G2 by a delay T1 of the output signal of the first delay circuit DLY1. In contrast, if BDATA is low, the NAND gate G1 reduces the signal out_low to be low regardless of signal delays by the first delay circuit DLY1. The NOR gate G2 reduces the signal out_hi to be low lagging behind the NAND gate G1 by a delay T2 of the output signal of the second delay circuit DLY2.

Such operation of the data control circuit 10 allows the transistors TP and TN2 to be turned off and then the transistor TN1 to be turned on when the digital data shifts from high to low (BDATA shifts from low to high). In contrast, when the digital data shifts from low to high (BDATA shifts from high to low), the transistor TN1 is turned off and then the transistors TP and TN2 are turned on. The period during which the transistors TN1, TP, and TN2 are turned on at the same time does not exist. The crossover current flowing from the voltage source VCCQ to VSS shown in FIG. 2 is thus avoided.

As shown in FIG. 4, the TN1 driving circuit 20 receives the signal out_low and outputs it as a gate signal NLO of the transistor TN1. The TP driving circuit 30 has a level shifter circuit for receiving the signal out_hi and converting it into VCCQ or VSS. The TP driving circuit 30 outputs VCCQ or VSS as a gate voltage PHI of the transistor TP. The TN2 driving circuit 40 receives the signal out_hi and outputs it as a gate signal NHI of the transistor TN2. In the first embodiment, the TN1 driving circuit 20 outputs the internal step-down potential VDD or VSS as the gate voltage NLO of the transistor TN1. The TN2 driving circuit 40 outputs the internal step-down potential VDD or VSS as the gate voltage NHI of the transistor TN2.

Ordinary products usually have I/O (input/output) pads that output and input pins commonly contact. When external data is loaded in the memory, the data output unit must have high impedance. While an output enable control circuit is usually provided, it is omitted in the first embodiment.

Figure 5:
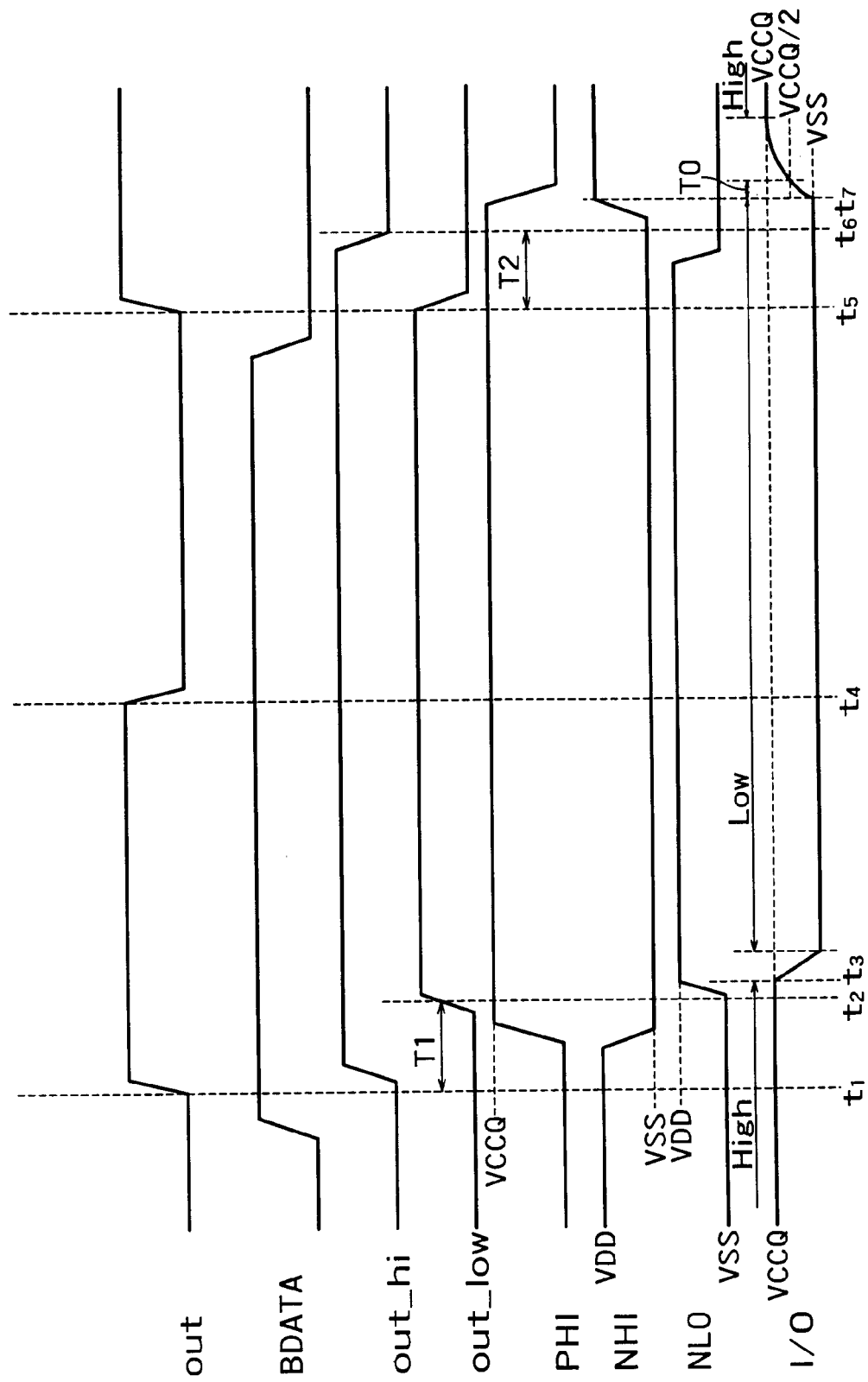
FIG. 5 is a timing chart showing the operation of the data output unit according to the first embodiment.

FIG. 5 is a timing chart showing the operation of the data output unit according to the first embodiment. BDATA rises from low to high. The data read from the memory cell is low.

The signal out is activated at t1, so that the data output unit starts the operation based on BDATA. The signal out_hi rises to be high immediately after t1. The TP driving circuit 30 makes the signal PHI high, while the TN2 driving circuit 40 makes the signal NHI low. The transistors TP and TN2 are turned off. At t2, the signal out_low rises to be high lagging behind the signal out_hi by the delay time T1 of the first delay circuit DLY1, as described above. The TN1 driving circuit 20 makes the signal NLO high. The transistor TN1 is thus turned on.

When the transistor TN1 is turned on at t3, the voltage of the output signal from the I/O terminal 4 is low (VSS). The I/O terminal 4 outputs a low level output signal until t7.

While the signal out is reduced to low at t4, the signals out_hi and out_low are maintained because BDATA is latched in the data control circuit 10. When the signal out shifts to low level, the data control circuit 10 stops receiving BDATA.

BDATA is reduced to low then. The data read from the memory cell is high. Activation of the signal out at t5 enables the data output unit to restart the operation based on the signal BDATA. The signal out_low is reduced to low immediately after t5. The TN1 driving circuit 20 makes the signal NLO low. The transistor TN1 is thus turned off. The signal out_hi is reduced to low at t6 lagging behind the signal out_low by the delay time T2 of the second delay circuit DLY2, as described above. The TP driving circuit 30 makes the signal PHI low, while the TN2 driving circuit 40 makes the signal NHI high. The transistors TP and TN2 are thus turned on.

When the transistors TP and TN2 are turned on at t7, the voltage of the output signal from the I/O terminal 4 is high (VCCQ). The time required for the output signal of the I/O terminal 4 to rise from VSS to VCCQ/2 is determined as T0.

Figure 6:
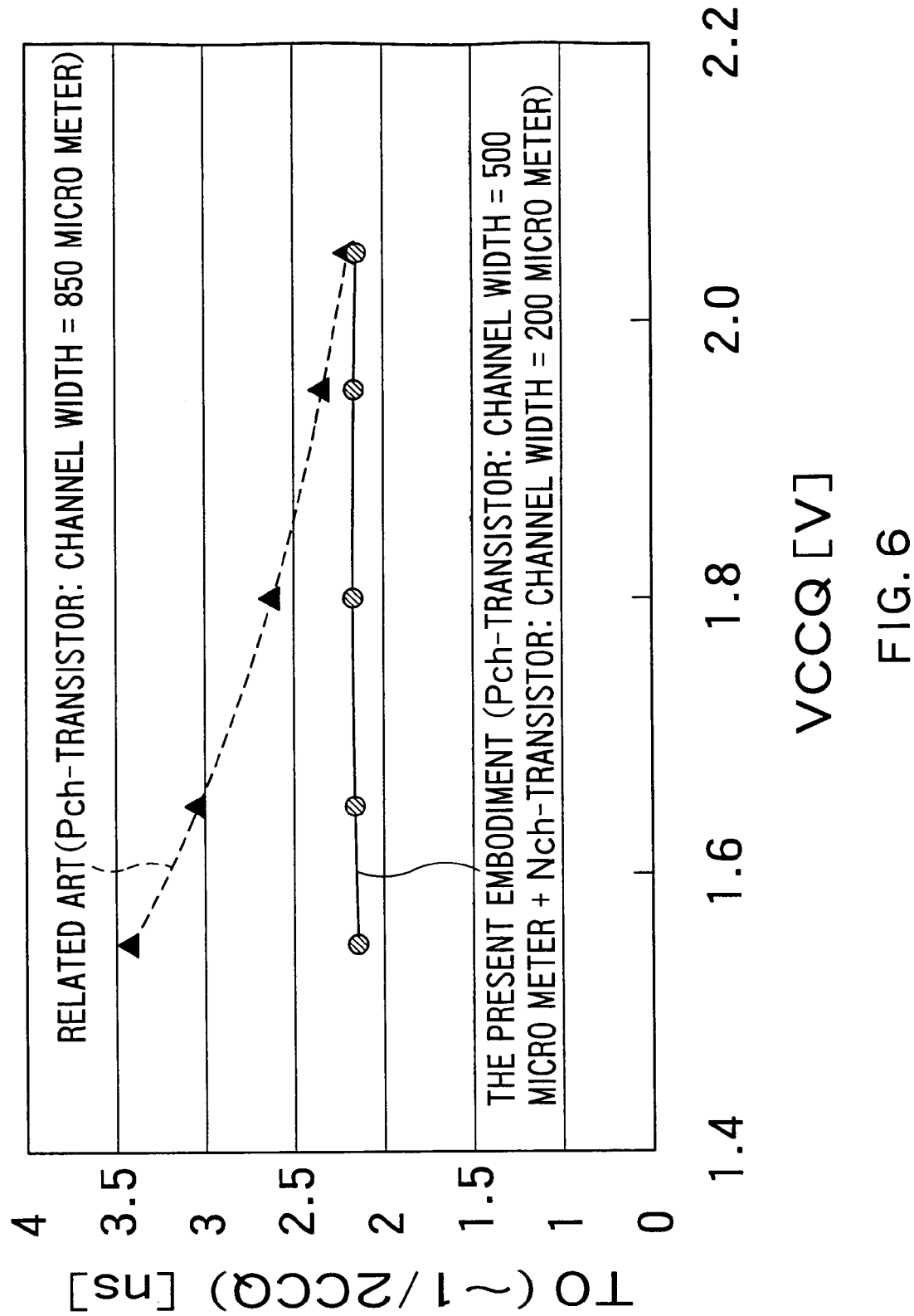
FIG. 6 is a graph showing the relationship between the rise time T0 of the output signal and the output high voltage VCCQ.

FIG. 6 is a graph showing the relationship between the rise time T0 of the output signal and the output high voltage VCCQ. Generally, the rise rate of output data of the NAND flash memory is determined by the time T0 required for rising from VSS to VCCQ/2. The shorter the time T0 is, the faster the data output rate is.

According to the related art, the transistor TN2 and TN2 driving circuit 40 shown in FIG. 2 are not provided. The output high voltage VCCQ is connected to the I/O terminal 4 only by the transistor TP. The transistor TP used in the related art has a size (gate width) of about 850 μm. If the output high voltage VCCQ decreases, the rise time T0 is extended, which means slow data output rate.

A reason why the time T0 is extended due to decreased output high voltage VCCQ is as follows. While the P-type transistor TP is turned on, 0V of VSS is applied to the gate of the P-type transistor TP. The absolute value of the gate-source voltage of the P-type transistor TP (|VCCQ-PHI|) is substantially equal to VCCQ. If VCCQ decreases, the conductance of the transistor TP is reduced, resulting in decreased slew rate of the data output unit. Conventionally, the slew rate of the data output unit depends greatly on the output high voltage VCCQ as the I/O supply voltage. A decrease in the output high voltage VCCQ thus extends the time T0.

To solve the above problem, the size (gate width) of the transistor TP may be increased. If VCCQ is, e.g., 1.8V, the voltage guarantee range is usually 1.65 to 1.95V. VCCQ must satisfy the specification of the rise time T0 in the range of 1.55 to 2.05 in consideration of operational margins. The size of the transistor TP must be set so that the time T0 when VCCQ is 1.55V satisfies the specification. In this case, the transistor TP may become significantly large. If the transistor TP is excessively large, the drive capability of the transistor TP is increased more than necessary when VCCQ is 2.05V, which leads to large output noise.

According to the first embodiment, the N-type transistor TN2 is connected in parallel to the P-type transistor TP, so that they connect VCCQ to the I/O terminal 4 in a complementary manner. The gate-source voltage of the transistor TN2 (difference in potential between NHI and I/O terminal 4) does not depend on the magnitude of VCCQ but on the potential of NHI. According to the first embodiment, even if VCCQ decreases, the switching rate of the transistor TN2 is maintained at high level because the potential of NHI is maintained at high level. As shown in FIG. 6, in the first embodiment, the rise time T0 is not extended even if VCCQ decreases. The data output rate is thus maintained at high level.

The size (gate width) of the transistor TP used is 500 μm and the size of the transistor TN2 is 200 μm. The sum of the sizes of the transistors TP and TN2 according to the first embodiment (750 μm) is smaller than the size of the conventional transistor TP (800 μm). The data output rate of the data output unit according to the first embodiment is faster than the conventional one.

As described above, the gate-source voltage of the N-type transistor TN2 does not depend on the magnitude of VCCQ but on the potential of NHI. The N-type transistor TN2 raises the potential of the I/O terminal 4 quickly when the signal NHI starts to rise. When the potential of the I/O terminal 4 is increased so that the difference in potential between NHI and the I/O terminal 4 is narrowed, the drive capability of the transistor TN2 is reduced. When the potential at the I/O terminal 4 increases, a decreasing rate of the drive capability of the P-type transistor TP is smaller than a decreasing rate of the drive capability of the transistor TN2. Even after the increase in the potential of the I/O terminal 4, the P-type transistor TP maintains the drive capability based on the absolute value of the gate-source voltage (|VCCQ-PHI|) as long as it is operated in the saturation region. The transistor TP increases the potential of the I/O terminal 4 raised by the transistor TN2 more quickly. The transistors TP and TN2 operate in a complementary manner so as to raise the output potential of the I/O terminal 4 in a shorter time even though the output high voltage VCCQ decreases. The flash memory of the first embodiment suppresses delays in the data output rate even if the output high voltage VCCQ decreases.

If the transistor TP is not provided, the transistor TN2 charges the potential of the I/O terminal 4 only up to the potential obtained by subtracting the threshold voltage of the transistor TN2 from the potential of NHI (VNHI-Vth). If the transistor TP is not provided, the potential of the I/O terminal 4 cannot be determined as VCCQ unless the potential of NHI is increased to VCCQ+Vth+α (α is a margin). In contrast, if the transistor TP is provided, the potential of the I/O terminal 4 is increased to the potential of NHI. The transistors TP and TN2 operate in a complementary manner in view of the output voltage of the I/O terminal 4 as well as in view of the data output rate.

If transistors for high voltage output are made so as to operate in a complementary manner, the transistors TP and TN2 become smaller than conventional ones. That leads to reductions in pin capacity and output noise.

In the first embodiment, the high level potential for the gate potential NHI of the transistor TN2 (the potential of NHI when the data in the memory cell is high) is the internal step-down potential VDD higher than the high level potential VCCQ of PHI (the potential of PHI when the data in the memory cell is low). The high level potential for the gate potential NHI of the transistor TN2 may be equal to the high level potential VCCQ of PHI in order to accomplish low power consumption. In view of faster data output, the high level potential of NHI is preferably higher than the high level potential of PHI.

SECOND EMBODIMENT

Figure 7:
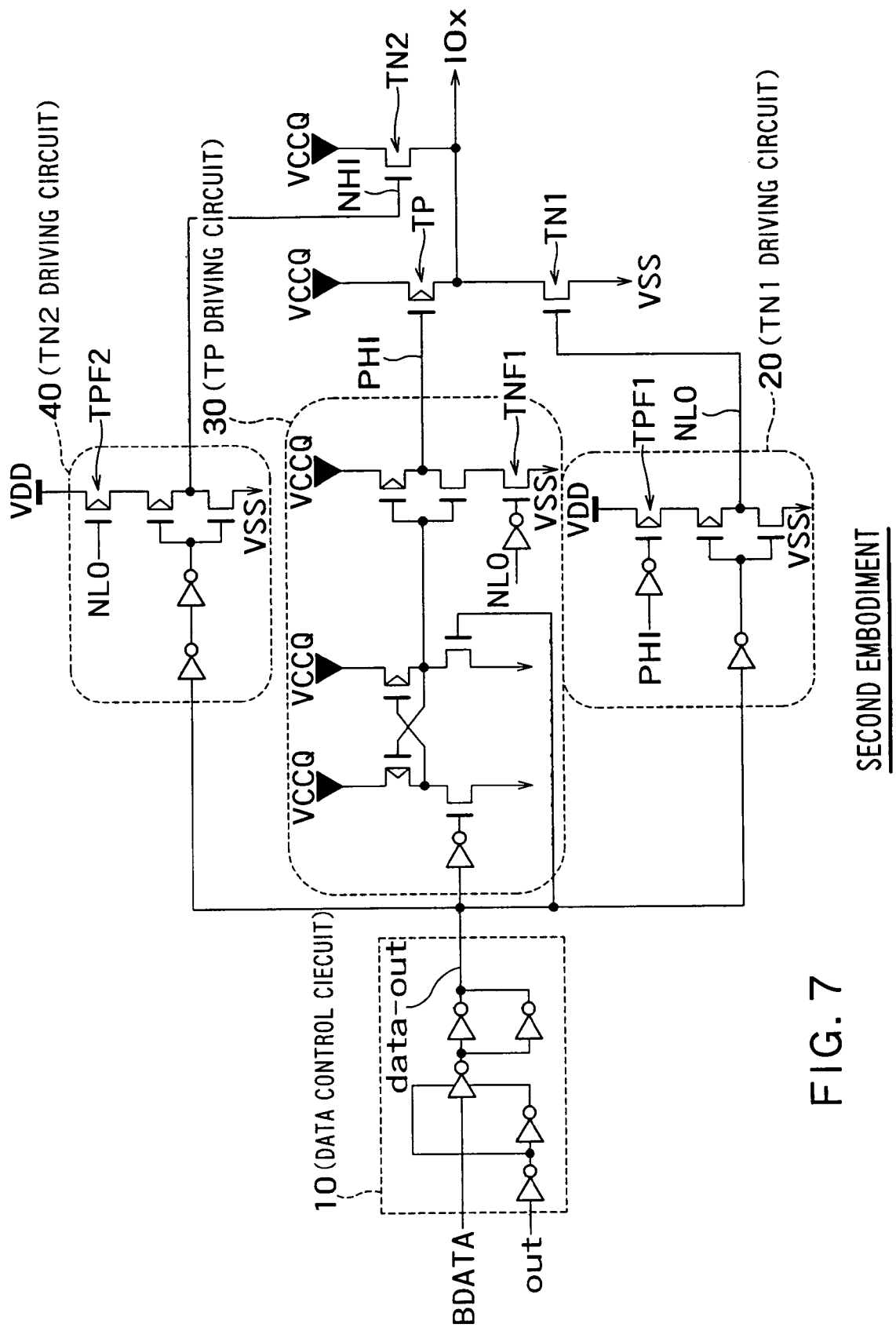
FIG. 7 shows the configuration of the data output unit according to a second embodiment.

FIG. 7 shows the configuration of the data output unit according to a second embodiment of the present invention. In the second embodiment, the gate voltages of the transistors TP and TN2 for high level output are fed back to the TN1 driving circuit 20 for low level output. The gate voltage of the transistor TN1 for low level output is fed back to the TP driving circuit 30 and TN2 driving circuit 40 for high level output.

When the data in the memory cell is high, the gate voltage NHI of the transistor TN2 is equal to the internal step-down potential VDD.

The TN1 driving circuit 20 includes a P-type feedback transistor TPF1 placed between VDD and VSS. The transistor TPF1 receives the inverted signal of the gate potential PHI of the transistor TP as the gate voltage. The transistor TPF1 receives the feedback of inverted signal of the gate potential PHI to perform the switching operation opposite to that of the transistor TP. For example, if the data in the memory cell is low, the TN1 driving circuit 20 receives the gate potential VCCQ of the transistor TP. The transistor TPF1 receives the inverted signal VSS of the high level VCCQ to be turned on and outputs the high level potential VDD as the signal NLO. The transistor TN1 receives the high level potential VDD to be turned on in a self-aligned manner. The low level VSS is thus outputted from the terminal 4. The transistor TPF1 can receive the gate potential NHI of the transistor TN2 as the gate voltage. The TN1 driving circuit 20 is operated in the same manner.

The TP driving circuit 30 includes an N-type feedback transistor TNF1 placed between VDD and VSS. The transistor TNF1 receives the inverted signal of the gate potential NLO of the transistor TN1 as the gate voltage. The transistor TNF1 performs the switching operation opposite to that of the transistor TN1. For example, when the data in the memory cell is high, the TP driving circuit 30 receives the gate potential VSS of the transistor TN1. The transistor TNF1 receives the inverted signal VDD of the low level VSS and outputs the low level potential VSS as the signal PHI. The transistor TP receives the low level potential VSS to be turned on in a self-aligned manner.

The TN2 driving circuit 40 includes a P-type feed back transistor TPF2 placed between VDD and VSS. The transistor TPF2 receives the potential NLO as the gate voltage. The transistor TPF2 performs the switching operation opposite to that of the transistor TN1. For example, when the data in the memory cell is high, the TN2 driving circuit 40 receives the gate potential VSS of the transistor TN1. The transistor TPF2 receives the low level potential VSS and outputs the high level potential VDD as the signal NHI. The transistor TN2 receives the signal NHI to be turned on in a self-aligned manner.

By driving the TN1 driving circuit 20, TP driving circuit 30, and TN2 driving circuit 40 as described above, when the transistor TN1 is turned on, the transistors TP and TN2 are turned off in a self-aligned manner, and when the transistors TP and TN2 are turned on, the transistor TN1 is turned off in a self-aligned manner. The crossover current flowing from VCCQ to VSS is suppressed in a self-aligned manner (automatically).

In the second embodiment, the data control circuit 10 merely outputs a signal out_data. The data control circuit 10 is simplified because it does not require the delay circuits DLY1 and DLY2 and the gates G1 and G2. The second embodiment achieves the same effects as in the first embodiment.

The potential of NHI is preferably higher than that of VCCQ. In the second embodiment, the high level potential for NHI (the potential of NHI when the data in the memory cell is high) is the internal step-down potential VDD. The high level potential for NLO (the potential of NLO when the data in the memory cell is low) is the internal step-down potential VDD. NHI and NLO need not to have the same potential.

THIRD EMBODIMENT

Figure 8:
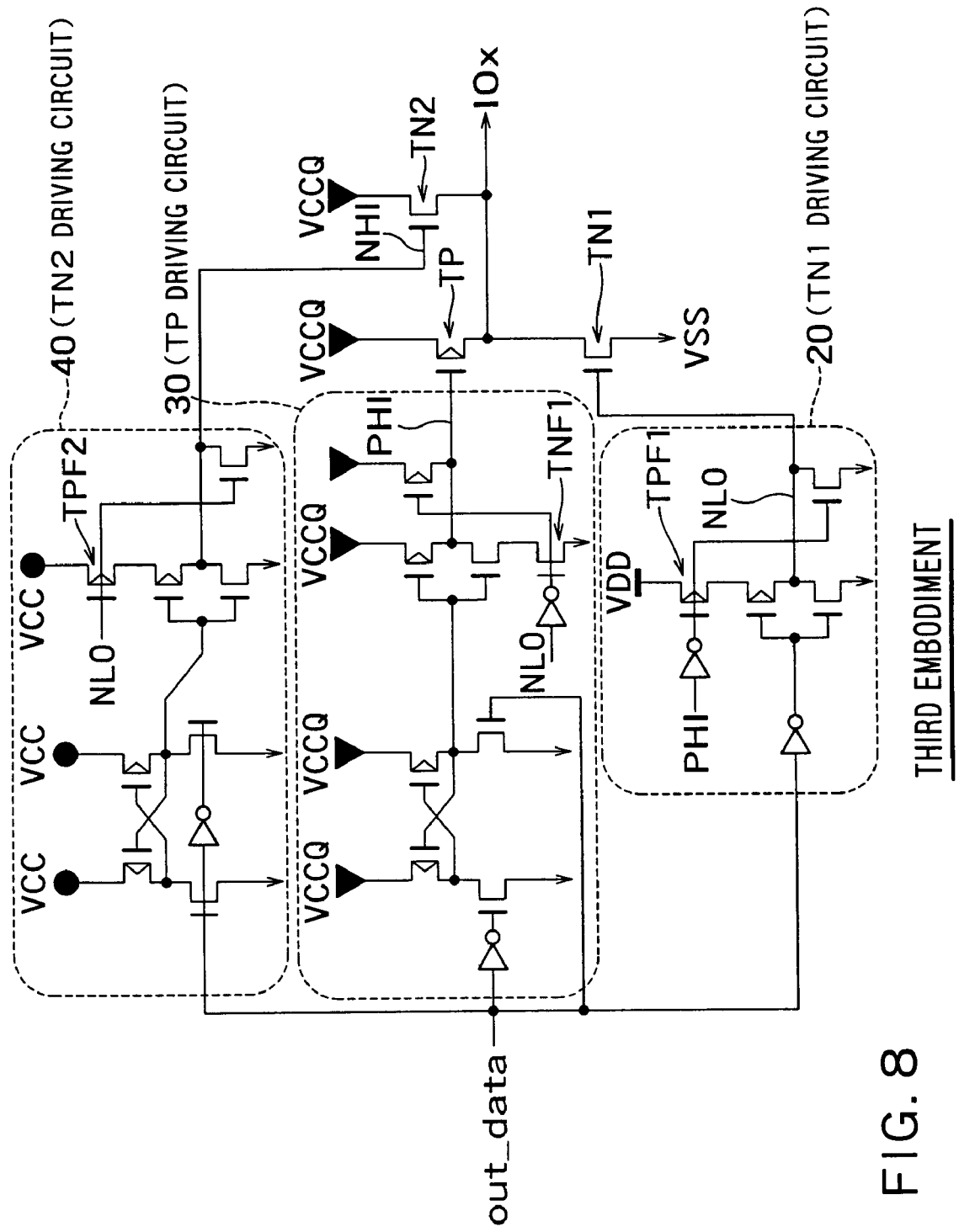
FIG. 8 shows the configuration of the data output unit according to a third embodiment.

FIG. 8 shows the configuration of the data output unit according to a third embodiment of the present invention. The third embodiment is different from the second embodiments in that the external supply voltage VCC is utilized as the power supply for the TN2 driving circuit 40. Other configurations in the third embodiment are the same as in the second embodiment. The third embodiment is the same as the second embodiment in that the gate voltages of the transistors TP and TN2 for high level output are fed back to the TN1 driving circuit 20 for low level output. When the data in the memory cell is low, the gate voltage PHI of the transistor TP is equal to the output high voltage VCCQ. When the data in the memory cell is high, the gate voltage NHI of the transistor TN2 is equal to the external supply voltage VCC.

The external supply voltage VCC is higher than the internal step-down potential VDD. The third embodiment thus accomplishes higher drive capability of the transistor TN2 as compared to the second embodiment. The third embodiment further suppresses delays in the data output rate. The third embodiment is applied to, e.g., products with 3.3V of the external supply voltage VCC and 1.8V of the output high voltage VCCQ.

FOURTH EMBODIMENT

Figure 9:
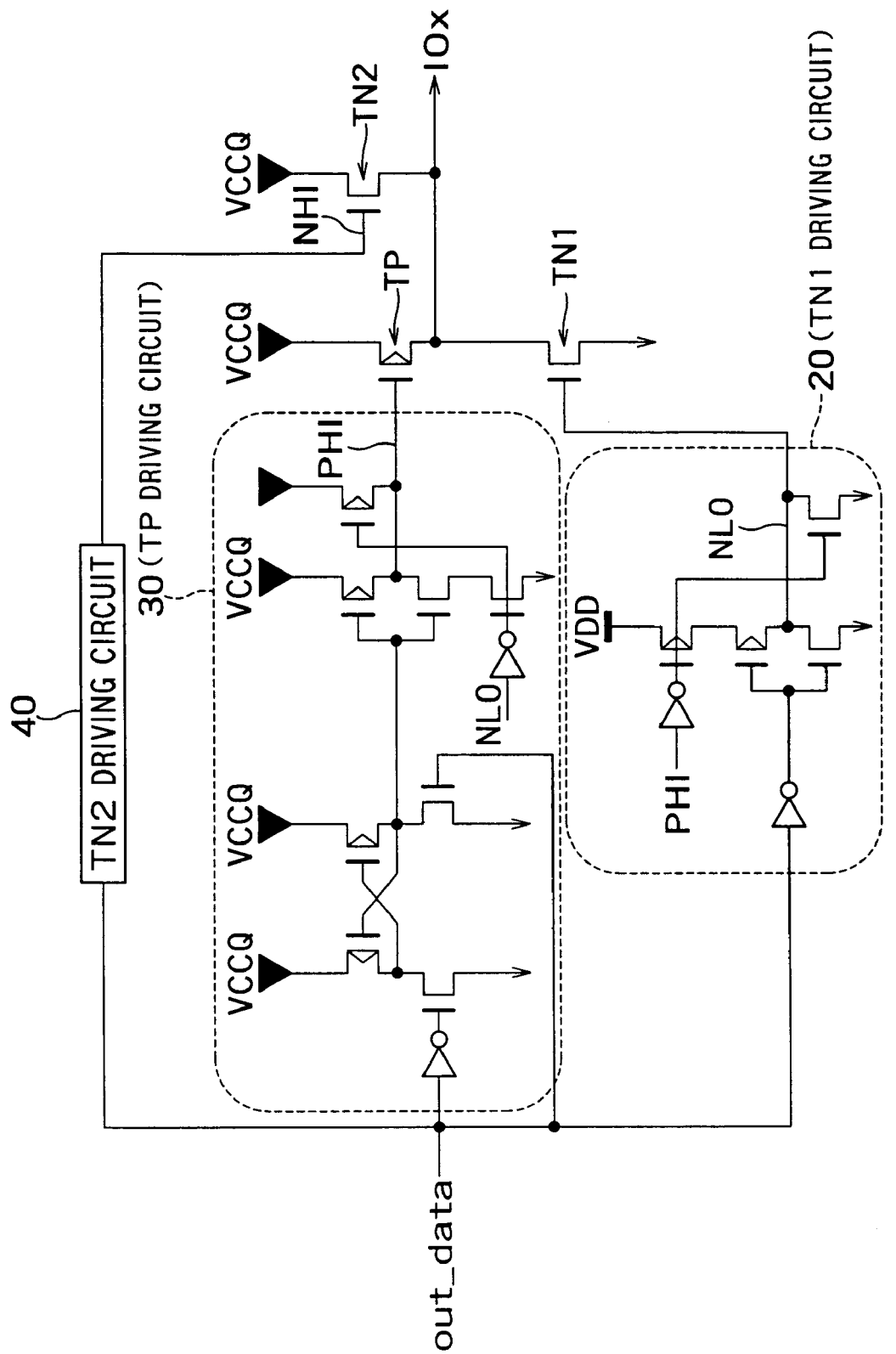
FIG. 9 shows the configuration of the data output unit according to a fourth embodiment.
Figure 10:
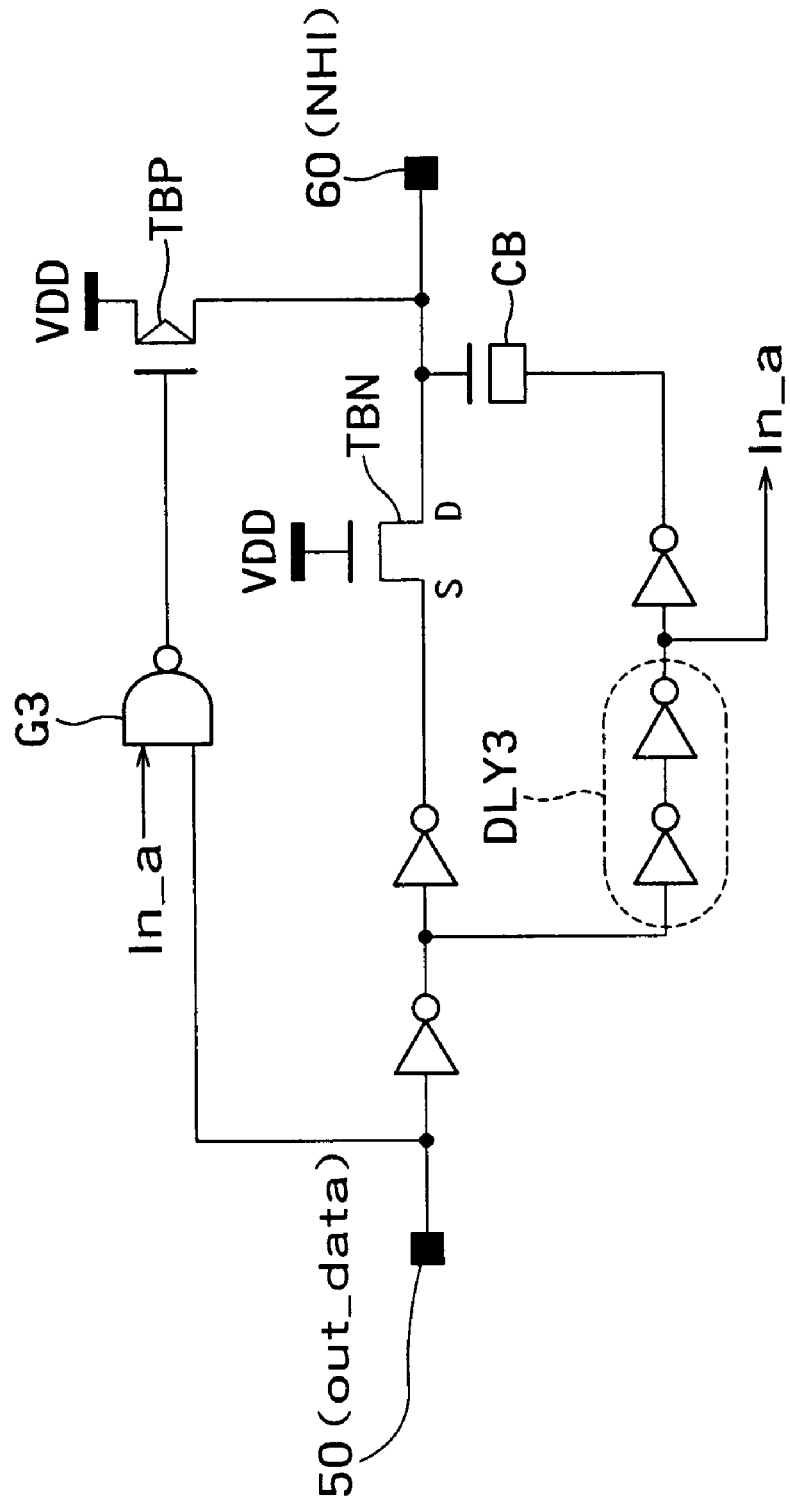
FIG. 10 is a circuit diagram showing the configuration of the TN2 driving circuit 40.

FIG. 9 shows the configuration of the data output unit according to a fourth embodiment of the present invention. FIG. 10 is a circuit diagram showing the configuration of the TN2 driving circuit 40. The fourth embodiment is different from the second embodiment in that an internal boosting potential obtained by boosting the internal step-down potential VDD is utilized as a high level power supply for the TN2 driving circuit 40.

The TN2 driving circuit 40 is configured to boost the internal step-down potential VDD. Specifically, the TN2 driving circuit 40 includes an N-type transistor TBN connected between an input unit 50 of the signal out_data and an output unit 60 of the signal NHI, a P-type transistor TBP connected between the internal step-down potential VDD and the output unit 60, and a capacitor CB for boosting the potential of the output unit 60. A gate of the transistor TBN is connected to the internal step-down potential VDD, its source to the input unit 50, and its drain to the output unit 60. The threshold voltage of the transistor TBN is indicated by Vtn. The input unit 50 is connected via a NAND gate G3 to the transistor TBP. The gate G3 receives the signal out_data and the inverted signal of the signal out_data delayed by the delay circuit DLY3 and outputs their operational result to the gate of the transistor TBP. The capacitor CB is formed of an N-type transistor whose source and drain are shorted. The source and drain of the capacitor CB are configured to receive the signal out_data delayed by the delay circuit DLY3. A gate is connected to the output unit 60.

The operation of the TN2 driving circuit 40 according to the fourth embodiment will be described with reference to FIG. 10. Assume that the signal out_data shifts from low to high. If the signal out_data is low, the gate G3 outputs the high level (VDD). The transistor TBP is thus in the off state. Because the source of the transistor TBN is low level, the output unit 60 is in the low level (VSS). Because the source and drain of the capacitor CB are low level, the boost operation is not performed.

While the input unit 50 is in the high level immediately after the signal out_data shifts from low to high, a signal In_a is maintained at high level for a while because of the delay circuit DLY3. The transistor TBP is turned on since the signal out_data shifts to high for the delay time of the delay circuit DLY3. As the source of the transistor TBN rises to the internal step-down potential VDD, the potential of the output unit 60 is charged to VDD-Vtn. The output unit 60 is charged to around VDD by the transistors TBP and TBN.

When the signal In_a shifts to low level, the transistor TBP is turned off and the transistor TBN supports the potential of the output unit 60. The source and drain of the capacitor CB are in the high level to boost the potential of the output unit 60 from VDD. The potentials of source and drain of the capacitor CB are indicated by $V\alpha$. The potential of the output unit 60 is boosted to VDD+$V\alpha$. The amount of boost $V\alpha$ for NHI is determined by the ratio of capacity of the capacitor CB to the capacity of node section of NHI and by the amount of amplitude of source and drain of the capacitor CB. The TN2 driving circuit 40 outputs the internal boosting potential VDD+$V\alpha$ as the high level potential of the signal NHI. When the data in the memory cell is high, the gate voltage of the transistor TN2 is the internal boosting potential VDD+$V\alpha$ obtained by boosting the internal step-down potential VDD. The drive capability of the transistor TN2 shown in FIG. 9 is improved. Delays in the data output rate of the semiconductor integrated circuit device according to the fourth embodiment is suppressed.

The TN2 driving circuit 40 can output the boosting potential VCC+$V\alpha$ of the external supply voltage VCC instead of the internal step-down potential VDD as the high level potential of the signal NHI. When the data in the memory cell is high, the gate voltage of the transistor TN2 may be the internal boosting potential VCC+$V\alpha$ obtained by boosting external supply voltage VCC. The drive capability of the transistor TN2 is further improved. Delays in the data output rate of the semiconductor integrated circuit device according to the fourth embodiment is thus further suppressed. The fourth embodiment can further achieve the same effects as in the second embodiment.

When the signal out_data shifts from high to low, the transistor TBP is in the off state and the capacitor CB does not perform the boost operation. The transistor TBN sends the low level (VSS) to the output unit 60. The TN2 driving circuit 40 thus outputs VSS as the low level potential of the signal NHI.

The invention claimed is:

1. A semiconductor integrated circuit device outputting digital data from an internal circuit via a pad to the outside comprising:
   a first transistor with a first conductive type which is connected between an output low voltage corresponding to a first logical value and the pad and which connects the output low voltage to the pad when the digital data has the first logical value;
   a second transistor with a second conductive type which is connected between an output high voltage corresponding to a second logical value and the pad and which connects the output high voltage to the pad when the digital data has the second logical value; and
   a third transistor with the first conductive type which is connected between the output high voltage and the pad so as to be parallel to the second transistor and which connects the output high voltage to the pad when the digital data has the second logical value.

2. The semiconductor integrated circuit device according to claim 1 further comprising:
   a first driver connected to a gate of the first transistor, the first driver turning the first transistor on when the digital data has the first logical value and turning the first transistor off when the digital data has the second logical value;
   a second driver connected to a gate of the second transistor, the second driver turning the second transistor off when the digital data has the first logical value and turning the second transistor on when the digital data has the second logical value; and
   a third driver connected to a gate of the third transistor, the third driver turning the third transistor off when the digital data has the first logical value and turning the third transistor on when the digital data has the second logical value.

3. The semiconductor integrated circuit device according to claim 2 further comprising:
   a first control circuit turning the first transistor on, after the second and third transistors are turned off, when the digital data shifts from the second logical value to the first logical value; and
   a second control circuit turning the second and third transistors on, after the first transistor is turned off, when the digital data shifts from the first logical value to the second logical value.

4. The semiconductor integrated circuit device according to claim 2, wherein a gate voltage of the third transistor when the digital data has the second logical value is equal to or higher than a gate voltage of the second transistor when the digital data has the first logical value.

5. The semiconductor integrated circuit device according to claim 2, wherein a gate voltage of the third transistor when the digital data has the second logical value is equal to a gate voltage of the first transistor when the digital data has the first logical value.

6. The semiconductor integrated circuit device according to claim 2, wherein the first driving circuit turns the first transistor on in a self-aligned manner according to the gate voltage of the second transistor when the digital data has the first logical value,
   the second driving circuit turns the second transistor on in a self-aligned manner according to a gate voltage of the first transistor when the digital data has the second logical value, and
   the third driving circuit turns the third transistor on in a self-aligned manner according to the gate voltage of the first transistor when the digital data has the second logical value.

7. The semiconductor integrated circuit device according to claim 2, wherein, when the digital data has the second logical value, the gate voltage of the third transistor is an internal step-down potential which is higher than the output high voltage and which is obtained by stepping down an external supply voltage to be provided to the semiconductor integrated circuit device.

8. The semiconductor integrated circuit device according to claim 2, wherein, when the digital data has the second logical value, the gate voltage of the third transistor is an external supply voltage which is higher than the output high voltage and which is provided to the semiconductor integrated circuit device.

9. The semiconductor integrated circuit device according to claim 2, wherein, when the digital data has the second logical value, the gate voltage of the third transistor is an internal boosting potential obtained by boosting the internal step-down potential which is higher than the output high voltage and which is provided by stepping down the external supply voltage to be provided to the semiconductor integrated circuit device.

10. The semiconductor integrated circuit device according to claim 2, wherein, when the digital data has the second logical value, the gate voltage of the third transistor is an internal boosting potential obtained by boosting the external supply voltage which is higher than the output high voltage and which is provided to the semiconductor integrated circuit device.

11. The semiconductor integrated circuit device according to claim 2, wherein, when the digital data has the first logical value, the gate voltage of the first transistor is an internal step-down potential which is provided by stepping down the external supply voltage to be provided to the semiconductor integrated circuit device.

12. The semiconductor integrated circuit device according to claim 1 further comprising:
a first control circuit turning the first transistor on, after the second and third transistors are turned off, when the digital data shifts from the second logical value to the first logical value; and
a second control circuit turning the second and third transistors on, after the first transistor is turned off, when the digital data shifts from the first logical value to the second logical value.

13. The semiconductor integrated circuit device according to claim 12, wherein the first and the third transistors are N-type transistors, the second transistor is a P-type transistor.

14. The semiconductor integrated circuit device according to claim 1, wherein the first and the third transistors are N-type transistors, the second transistor is a P-type transistor.

15. The semiconductor integrated circuit device according to claim 2, wherein the first and the third transistors are N-type transistors, the second transistor is a P-type transistor.

16. A semiconductor integrated circuit device outputting digital data from an internal circuit via a pad to the outside comprising:
a memory cell array; and
a data output circuit outputting the digital data from the memory cell array comprising:
a first transistor with a first conductive type which is connected between an output low voltage corresponding to a first logical value and the pad and which connects the output low voltage to the pad when the digital data has a first logical value;
a second transistor with a second conductive type which is connected between an output high voltage corresponding to a second logical value and the pad and which connects the output high voltage to the pad when the digital data has a second logical value; and
a third transistor with the first conductive type which is connected between the output high voltage and the pad so as to be parallel to the second transistor and which connects the output high voltage to the pad when the digital data has the second logical value.

17. The semiconductor integrated circuit device according to claim 16 further comprising:
a first driver connected to a gate of the first transistor, the first driver turning the first transistor on when the digital data has the first logical value and turning the first transistor off when the digital data has the second logical value;
a second driver connected to a gate of the second transistor, the second driver turning the second transistor off when the digital data has the first logical value and turning the second transistor on when the digital data has the second logical value; and
a third driver connected to a gate of the third transistor, the third driver turning the third transistor off when the digital data has the first logical value and turning the third transistor on when the digital data has the second logical value.

18. The semiconductor integrated circuit device according to claim 17, wherein the gate voltage of the third transistor provided by the third driving circuit when the digital data has the second logical value is higher than the gate voltage of the second transistor provided by the second driving circuit when the digital data has the first logical value.

* * * * *